United States Patent [19]

Watanabe

[11] Patent Number: 4,577,095

[45] Date of Patent: Mar. 18, 1986

[54] AUTOMATIC FOCUSING APPARATUS FOR A SEMICONDUCTOR PATTERN INSPECTION SYSTEM

[75] Inventor: Tomohide Watanabe, Yokohama, Japan

[73] Assignee: Tokyo Shibaura Denki Kabushiki Kaisha, Kawasaki, Japan

[21] Appl. No.: 472,604

[22] Filed: Mar. 7, 1983

[30] Foreign Application Priority Data

Mar. 8, 1982 [JP] Japan .................................. 57-35260

[51] Int. Cl.$^4$ ............................................................ G01V 1/20
[52] U.S. Cl. ............................................ 250/201; 250/204
[58] Field of Search .......... 250/201 PF, 204, 201 DF; 356/4; 354/406, 407, 408

[56] References Cited

U.S. PATENT DOCUMENTS

| | | | |
|---|---|---|---|
| 3,967,110 | 6/1976 | Rogers et al. | 250/201 PF |
| 4,220,850 | 9/1980 | McEachern | 250/204 |
| 4,230,940 | 10/1980 | Minami et al. | 250/201 |
| 4,333,716 | 6/1982 | Sakane et al. | 250/201 PF |
| 4,341,953 | 7/1982 | Sakai et al. | 250/201 PF |
| 4,349,254 | 9/1982 | Jyojiki et al. | 250/201 PF |

Primary Examiner—David C. Nelms
Assistant Examiner—J. Jon Brophy
Attorney, Agent, or Firm—Finnegan, Henderson, Farabow, Garrett & Dunner

[57] ABSTRACT

Disclosed is an automatic focusing apparatus which comprises an objective disposed in opposition to a substrate with patterns formed thereon, a first line sensor disposed at a first focal point of the focal length of the objective, second and third line sensors which are disposed closer to and farther from the objective by a given distance with respect to second and third focal points of the focal length of the objective, first to third differential circuits for differentiating the output signals from the first to third line sensors, a detecting circuit for detecting a displacement of the substrate from a predetermined proper distance between the objective and the substrate on the basis of the output signals from the first to third differential circuits, and a correcting device for correcting the displacement on the basis of the output signal from the detecting circuit. Thus, a single optical system is used for automatically correcting focus and pattern inspection.

6 Claims, 24 Drawing Figures

AUTOMATIC FOCUSING APPARATUS FOR A SEMICONDUCTOR PATTERN INSPECTION SYSTEM

BACKGROUND OF THE INVENTION

The present invention relates to an automatic focusing apparatus and pattern imaging system, and more particularly to an automatic focusing apparatus and pattern imaging system for inspecting the patterns formed on semiconductor subtrates.

With progress of the photolithograph, various types of patterns, such as a pattern of a metal layer formed on the semiconductor substrate, must be formed with great precision. The same thing is true for pattern inspection, that is, it must be determined whether or not the pattern has defects, the pattern size is proper, the distance between adjacent patterns is proper, the pattern is distorted, the pattern quality is satisfactory, or the pattern is displaced from its correct position etc.

An inspecting system for effecting such inspection thus far employed takes a photograph of a pattern compares the photograph with a given reference of the pattern. This inspecting system, however, has inevitably a problem that a flatness of the surface of the substrate with a pattern formed thereon greatly influences precision of the pattern image. More specifically, if the surface of the substrate is wavy or rugged, a distance of the pattern from an optical system in an imaging apparatus varies. The result is that an image point of the pattern varies in the imaging system.

Therefore, the pattern image is blurred. To avoid this, the conventional system is provided with an automatic focusing apparatus which detects an out-of-focus in the optical system and corrects the same on the basis of the detected one. The automatic focusing apparatus uses an airomicro type sensor for sensing an out-of-focus of the pattern. However, the airomicro type sensor has a low detecting accuracy and a slow sensing response. The sensor requires an air compressor for feeding compressed air. The use of the sensor, therefore, makes the pattern inspecting system bulky.

Further, conventionally, the pattern imaging system and the focusing system each need an optical systems. Therefore, the whole system is bulky, complicated and costly.

SUMMARY OF THE INVENTION

Accordingly, an object of the present invention is to provide a small-size, light-weight, and simply constructed automatic focusing apparatus with accuracy and speed of out-of-focus detection.

According to the invention, there is provided an automatic focusing apparatus comprising an objective disposed in opposition to the surface of a substrate with a pattern formed thereon, a first photosensitive element disposed at a first focal point of the focal length of said objective and excited according to an amount of incident light, a second photosensitive element disposed closer to said objective by a given distance with respect to a second focal point of the focal length of said objective and excited according to an amount of incident light, a third photosensitive element disposed farther from said objective by said given distance with respect to a third focal point of the focal length of said objective and excited according to an amount of incident light, first sensing means for producing an electrical signal on the basis of an excitation distribution of said first photosensitive element, second sensing means for producing an electrical signal on the basis of an excitation distribution of said second photosensitive element, third sensing means for producing an electrical signal on the basis of an excitation distribution of said third photosensitive element, a first differential circuit for differentiating an output signal from said first sensing means, a second differential circuit for differentiating an output signal from said second sensing means, a third differential circuit for differentiating an output signal from said third sensing means, detecting means for detecting a displacement of said substrate from a predetermined proper distance between said objective and said substrate on the basis of the output signals from said first to third differentiating circuits, and correcting means for correcting said displacement on the basis of an output signal from said detecting means.

DETAILED DESCRIPTION OF THE PREFERRED EMBODIMENT

Figures 1, 2:
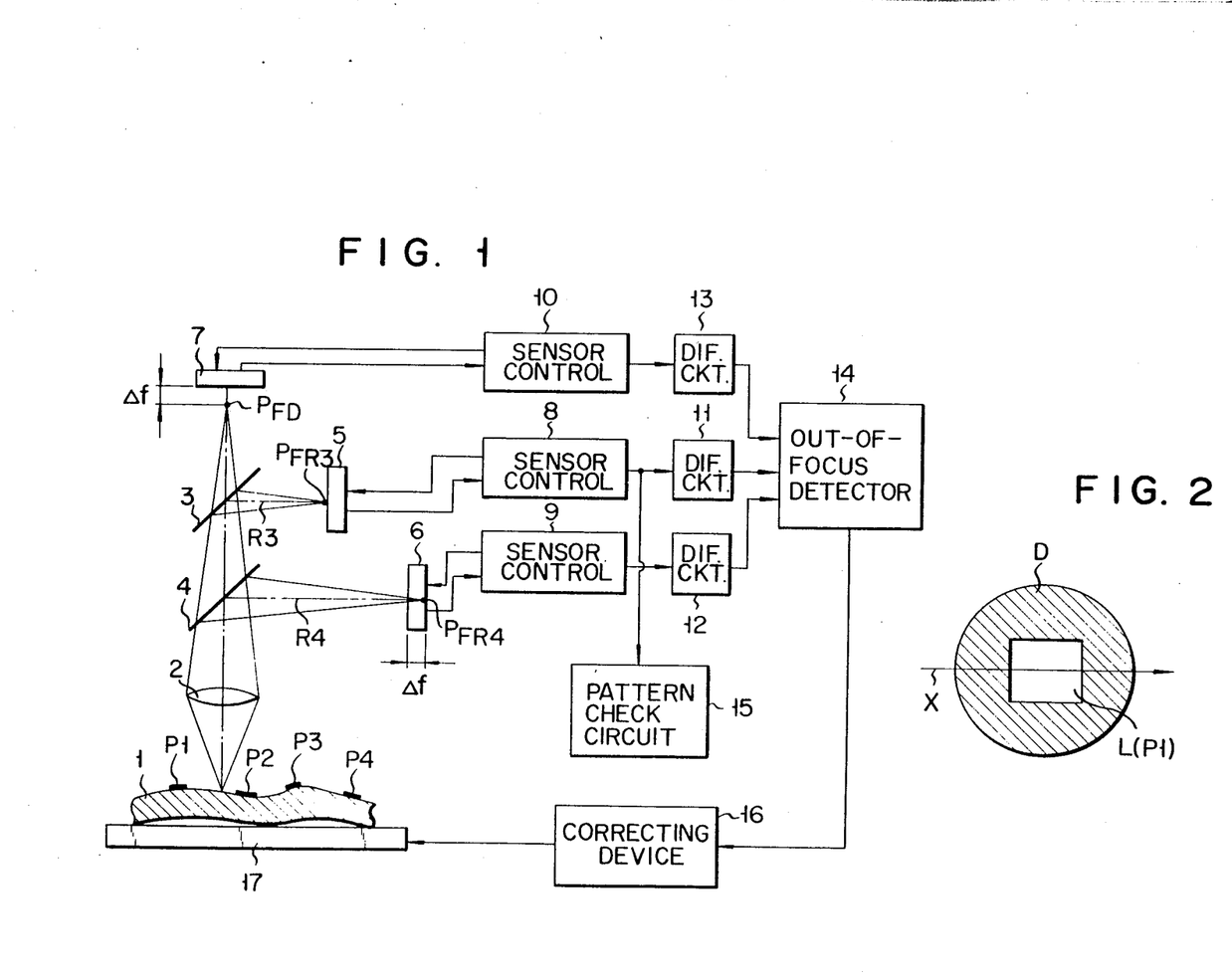
FIG. 1 shows a schematic and circuit diagram of an embodiment of an automatic focusing apparatus according to the present invention.
FIG. 2 shows an image pattern on a line sensor when a pattern under inspection is scanned.

FIG. 1 schematically shows an automatic focusing apparatus according to an embodiment of the present invention. An objective 2 is disposed in opposition to a substrate, for example, a semiconductor substrate 1. Metal patterns P1 to P4 are formed on the surface of the semiconductor substrate 1 confronting the objective 2. A pair of half mirrors 3 and 4 are disposed on the axis of the objective 2. The mirror 4 is located closer to the objective 2 than the mirror 3 is. The half mirrors 3 and 4 are inclined at 45° to the objective 2 and disposed substantially parallel with each other. Since the half mirrors 3 and 4 are positioned, part of incident light transmitted through the objective 2 is allowed to go straight along the axis of the objective 2, while the remaining light is deflected substantially at 45° to the axis of the objective 2. The optical path of the light which straight goes will be hereinafter called "straight optical path" and the optical path of the deflected light "deflected optical path". A first line sensor 5 is disposed on the deflected optical path R3 of the half mirror 3. The input face of the first line sensor 5 is positioned at a first focal point $P_{FR3}$ on the deflecting optical path R3. A second line sensor 6 is disposed on a deflecting optical path R4 of the half mirror 4. The output face of the second line sensor 6 is positioned at a second focal point $P_{FR4}$ on the deflecting optical path R4 of the objective 2. The input face of the sensor 6 is located at a distance $\Delta f$ closer from the second focal point $P_{FR4}$. A third line sensor 7 is provided on the straight optical path D of the objective 2. The input face of the third line sensor 7 is located a distance $\Delta f$ farther from the objective 2 than a third focal point $P_{FD}$ of the objective 2. Line sensors 5 to 7 are excited according to an amount of incident light and detect edges of the patterns P1 to P4. First to third sensor control circuits 8, 9 and 10 are respectively connected to the first to third line sensors 5 to 7. These sensor control circuits 8, 9 and 10 produce pulse signals according to excitation distributions in the line sensors 5 to 7. The sensor control circuits 8, 9 and 10 are connected to differential circuits 11, 12 and 13, respectively, which differentiate pulse signals. The differential circuits 11, 12 and 13 are connected to an out-of-focus detector 14 for detecting an out-of-focus of the objective 2 or a displacement of the pattern from a predetermined object point, on the basis of the output signals from the differential circuits 11, 12 and 13. The output terminal of the first sensor control circuit 8 is connected to the differential circuit 11 and also to a pattern check circuit 15. The pattern check circuit 15 receives the output signal from the first sensor control circuit 8 and electrically analyzes an optical signal incident on the input surface of the first line sensor 5 to see whether or not defects are contained in the pattern image, the pattern size is proper, the distance between adjacent patterns is proper, the pattern is distorted, the pattern quality is satisfactory, or the pattern is displaced from its correct position, and so forth. Pattern check circuits like pattern check circuit 15 are known in the art. The out-of-focus detector 14 is connected to a correcting device 16. The correcting device 16 responds to the output signal from the out-of-focus detector 14 to adjust a height of a support table 17 on which the semiconductor substrate 1 is placed. Through this adjustment, a distance between the objective 2 and the semiconductor substrate 1 is set at a proper predetermined one so that the pattern is imaged on the input face of the first line sensor 5. In this way, the height of the support table 17 is adjusted to keep the substrate 1 at a proper distance from the lens 2, ensuring a correct pattern check.

The operation of the automatic focusing apparatus shown in FIG. 1 will be described.

For pattern inspection, the semiconductor substrate 1 is imaged by the first to third line sensors 5 to 7 in the manner described below.

The light beam from the substrate 1 passes through the objective 2 to the half mirrors 3 and 4. A part of the light beam passes through the half mirrors 3 and 4 along the axis of the objective 2 and is incident on the line sensor 7. The remaining part of the light beam is deflected substantially 45°. The light beam deflected by the mirror 3 is incident on the line sensor 5. The light beam deflected by the mirror 4 is incident upon the second line sensor 6. The first to third line sensors 5 to 7 are excited according to an amount of light incident upon the input faces. The first to third sensor control circuits 8, 9 and 10 produce pulse signals which depend on excitation distributions of the first to third line sensor 5 to 7, respectively. The output pulse signals from the first to third sensor control circuits 8, 9 and 10 are input to the differential circuits 11, 12 and 13 and are differentiated. They then are applied to the out-of-focus detector 14. The out-of-focues detector 14 detects an amount of the out-of-focus on the basis of the differentiated signals from the differential circuits 11, 12 and 13. The output signal from the first sensor control circuit 8 corresponds to a signal from the first line sensor 5 whose input face is located at the first focal point of the objective 2. The output signal from the first sensor control circuit 8 is also applied to the pattern check circuit 15. The pattern check circuit 15 electrically recognizes a pattern represented by the signal and compares the signal with a reference signal representing a desired pattern for pattern inspection. Through this process, it is judged whether or not the pattern has defects, the pattern is proper, the distance between adjacent patterns is proper, the pattern is distorted, the pattern quality is fine, or the pattern is displaced from its correct position, and so forth.

Figure 3A:
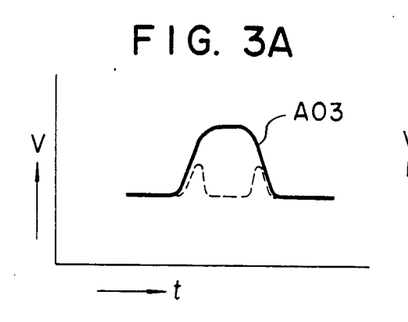
FIGS. 3A to 3C are waveforms of output signals from line sensors in the automatic focusing apparatus in FIG. 1.
Figure 3B:
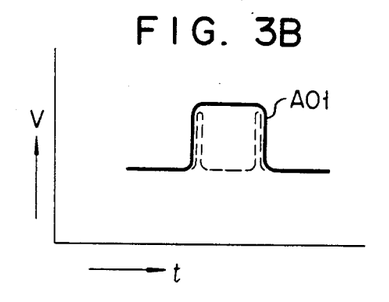
Figure 3C:
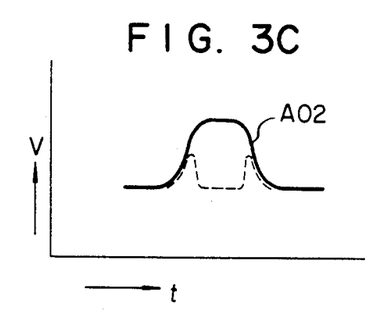
Figure 4A:
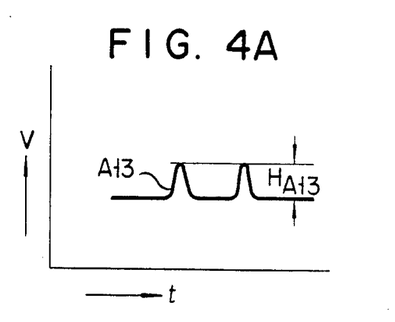
FIGS. 4A to 4C show waveforms of signals of FIGS. 3A to 3C which are differentiated.
Figure 4B:
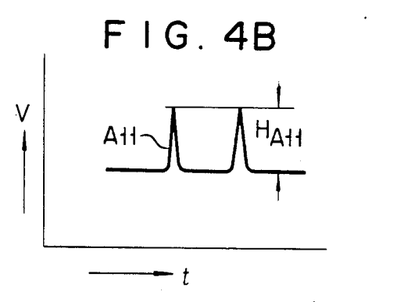
Figure 4C:
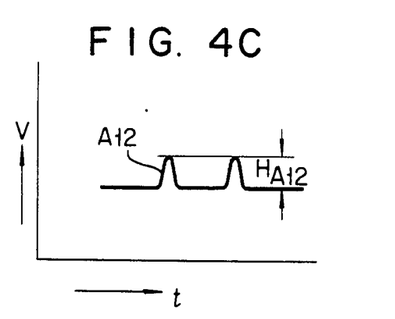

Assume now that a portion of the semiconductor substrate 1 having the pattern P1 is flat and the pattern P1 is located so that it is imaged at the input face of the first line sensor 5. The region of the semiconductor substrate 1 containing the pattern P1 is then imaged on the input face of the first line sensor 5. In this case, an excitation distribution on the first line sensor 5 is as illustrated in FIG. 2. In FIG. 2, a white portion L corresponds to the pattern P1, and a slanted portion to the substrate region. The semiconductor substrate region including the pattern P1 is not imaged on the faces of the lines sensors 6 and 7, because these input faces are not positioned at the focal points $P_{FR4}$ and $P_{FD}$, respectively. Excitation distributions of the line sensors 6 and 7 are different from that (FIG. 2) of the line sensor 5, and are not sharp at the boundary region between the pattern P1 and the substrate region. Accordingly, the first to third sensor control circuits 8, 9 and 10 produce pulse signals A03, A01 and A02 as shown in FIGS. 3A, 3B and 3C. In FIGS. 3A to 3C in which abscissa represents time, and the ordinate voltage, waveforms as indicated by dotted line indicate differentiated waveforms. Also in FIGS. 4A to 4C, FIGS. 5A to 5C, and FIGS. 6A to 6C, the abscissa represents time, and the ordinate voltage. Since the line sensor 5 has an image of the pattern P1 on its input face and therefore, as shown in FIG. 3B, the level of an output signal A01 sharply rises and falls. Since no image is formed on the input face of the line sensors 6 and 7, the levels of the output signals A02 and A03 gently rise and fall. The displacements of the input faces of the line sensors 6 and 7 from the focal points $P_{FR4}$ and $P_{FD}$ of the objective 2 are equal, i.e. $\Delta f$. Therefore, the waveforms of the signals A02 and A03 are substantially indentical. The output pulse signals A01 and A03 from the first to third sensor control circuits 8, 9 and 10, (FIGS. 3B, 3C and 3A) are applied to the differential circuits 11, 12 and 13 and differentiated to provide signals A11 to A13 with waveforms, as shown in FIGS. 4B, 4C and 4A. In FIGS. 4B, 4C and 4A, $H_{A11}$ to $H_{A13}$ designate peak values of the signals A11 to A13, respectively. These differentiated outputs are applied to the out-of-focus detector 14. The out-of-focus detector 14 compares the peak values $H_{A11}$ to $H_{A13}$ of the signals A11 to A13 to detect an amount of the out-of-focus. More specifically, if the amounts of light incident upon the line sensors 6 and 7, which are separated $\Delta f$ from the focal points $P_{FR4}$ and $P_{FD}$ in the opposite directions, are equal, the peak value $H_{A12}$ of the signal A12 is equal to that $H_{A12}$ of the signal A13.

Accordingly, they are compared with each other. When no out-of-focus of the lens 2 is detected, the peak value $H_{A11}$ of the signal A11 is larger than values $H_{A12}$ and $H_{A13}$ of the signals A12 and A13. At this time, the two peak values $H_{A12}$ and $H_{A13}$ are compared with the peak value $H_{A11}$ to check the following relations: $H_{A12} = H_{A13}$, $H_{A11} > H_{A12}$, and $H_{A11} > H_{A13}$. Then, a signal representing $Vs = (H_{A13} - H_{A11}) - (H_{A12} - H_{A11})$ is produced. When the above condition is satisfied, the output signal Vs from the out-of-focus detector 14 is $Vs = 0$, that is, the detector 14 produces no output signal. Since the pattern P1 is formed on the flat portion of the semiconductor substrate 1, the peak values $H_{A12}$ and $H_{A13}$ of the signals A12 and A13 are equal to each other as shown in FIGS. 4C and 4A. Further, it was assumed that the pattern is imaged on the input face of the first sensor 5. Accordingly, the peak value $H_{A11}$ of the signal A11 is larger than these $H_{A12}$ and $H_{A13}$ of the signals A12 and A13. The above conditions are satisfied, and $Vs = 0$. Thus, no signal is produced from the out-of-focus detector 14, and the correcting device 16 does not operate. The height of the substrate 1 is not changed.

Figure 5A:
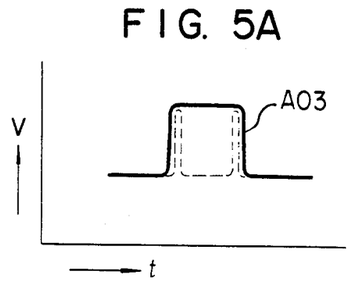
FIGS. 5A to 5C are waveforms of output signals from line sensors in the focusing apparatus shown in FIG. 1.
Figure 5B:
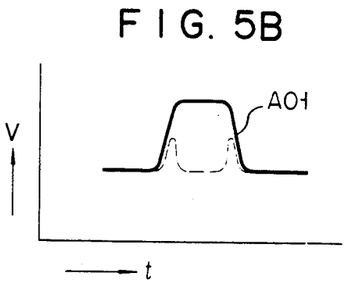
Figure 5C:
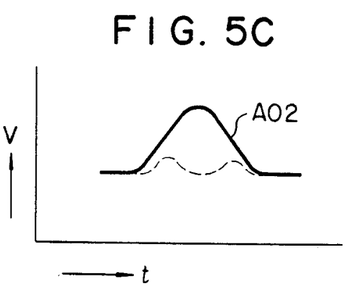
Figure 6A:
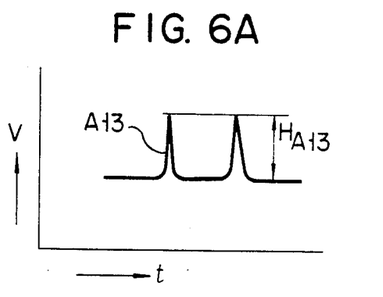
FIGS. 6A to 6C are waveforms of signals when the signals of FIGS. 5A to 5C are differentiated.
Figure 6B:
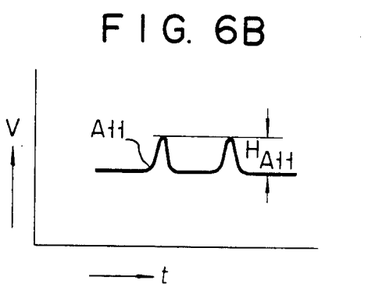
Figure 6C:
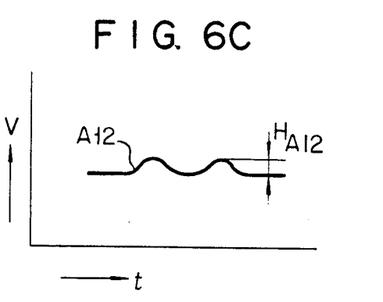

If the pattern P1 is formed on a convex portion of the semiconductor substrate 1, not on the flat portion, the pattern is not imaged on the input face of the line sensor 5. The sensors 6 and 7 whose the input faces are displaced from the focal point $P_{FR4}$ and $P_{FD}$ of the lens 2 by $\Delta f$ are more intensively excited than the sensor 5. For example, the line sensor 7 whose input face is located $\Delta f$ apart from the focal point $P_{FD}$ is most intensively excited. In this case, the output signals A01 to A03 from the control circuits 8 to 10 have such waveforms as shown in FIGS. 5B, 5C and 5A. In FIGS. 5A, 5B and 5C, broken lines indicate the waveforms of the differentiated signals A01 to A03. The level of the signal A03 of the control circuit 10 corresponding to the line sensor 7 most sharply rises and falls. The level of the signal A01 of the control circuit 8 corresponding to the line sensor 5 more gently rises and falls than the signal A03. The signal A02 from the control circuit 9 corresponding to the line sensor 6 is most gentle in the rise and fall. Thus, the waveforms of the signals A01 to A03, after differentiated by the differentiating circuits 11 to 13, take waveforms of signals A11 to A13, as shown in FIGS. 6B, 6C and 6A, respectively. These signals are input to the out-of-focus detector 14 for detecting an amount of the out-of-focus. In this case, the peak values $H_{A12}$ and $H_{A13}$ of the signals A12 and A13 are not equal to each other. The peak value $H_{A11}$ of the signal A11 is larger than the peak value $H_{A12}$ of the signal A12, but is smaller than that $H_{A13}$ of the signal $A_{13}$. Therefore, the above condition is not satisfied. The detector circuit 14 produces a signal representative $Vs = (H_{A13} - H_{A11}) - (H_{A12} - H_{A11})$. This signal indicates that the pattern P1 is formed on the convex portion of the substrate 1. This signal also indicates that the pattern P1 is of the focal point of the objective 2, that is, the pattern P1 is not positioned at the predetermined proper position. An amount and a direction of the out-of-focus of the lens, or a displacement of the pattern from the predetermined position are recognized from an absolute value and a positive or negative sign of the output signal Vs. More specifically, the amount of the out-of-focus is represented by an absolute value of the output signal. As for the direction of the displacement of the pattern, when the output signal Vs is positive, the pattern P1 is located further from the objective 2. When the signal Vs is negative, it is located closer to the objective 2. The correcting device 16 receives the signal Vs from the detector circuit 14 to move the support table 17 in the direction opposite to the direction of the out-of-focus by the distance thereof. In this way, the distance between the pattern 1 and the lens 2 is corrected to the predetermined proper one and the pattern P1 is imaged on the input face of the first line sensor which is positioned at the focal point $P_{FR3}$ of the objective 2.

Figure 7:
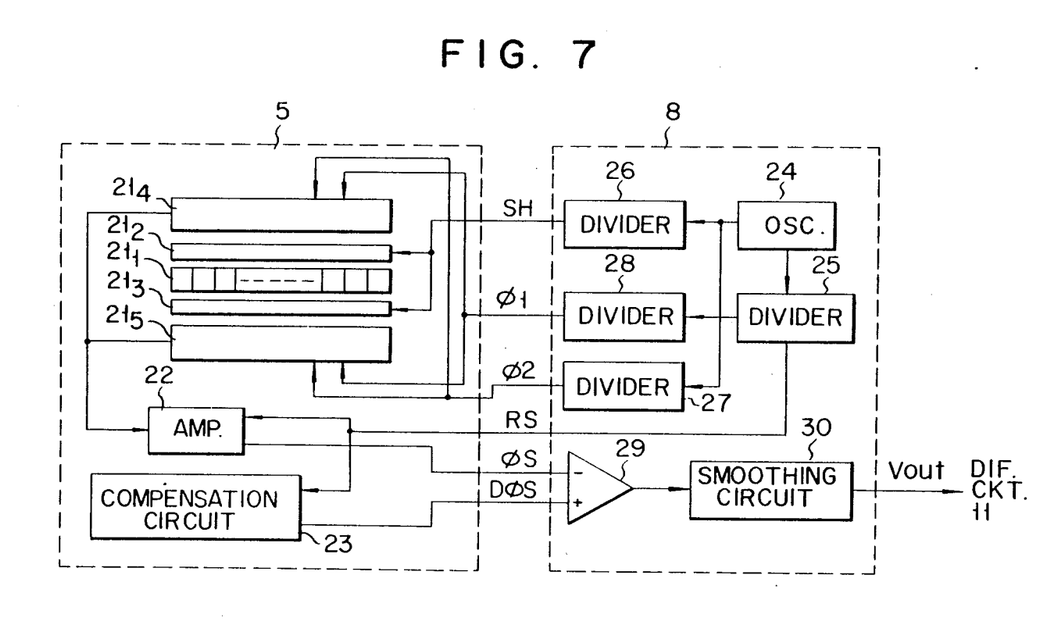
FIG. 7 shows a detailed circuit diagram of a line sensor and a line sensor control in the apparatus in FIG. 1.

FIG. 7 shows a detailed arrangement of the first line sensor 5 and the sensor control circuit 8 of the focusing apparatus in FIG. 1. The remaining line sensors 6 and 7 have each the same construction as that of the line sensor 5 and the remaining control circuits 9 and 10 have the same construction as that of the control circuit 8.

The line sensor 5 may be a charge coupled device (CCD) and comprises a photosensitive area $21_1$, shift gates $21_2$ and $21_3$ for controlling the transfer of charge stored in the photosensitive area $21_1$, analog shift registers $21_4$ and $21_5$ for storing the charge transferred through the shift gates $21_2$ and $21_3$, an amplifier 22 for amplifying the output signal from the analog shift registers $21_4$ and $21_5$ and a correcting circuit 23 for correcting the output signal of the amplifier 22. The differential circuit 11 is comprised of an oscillator 24 containing a crystal resonator, for example, for stably oscillating clock pulses, first to third frequency dividers 25, 26, and 27 for frequency-dividing the output pulse from the oscillator 24, a fourth frequency divider 28 for frequency-dividing the output signal from the divider 25, a differential amplifier 29 for receiving the output signals from the amplifier 22 and the correcting circuit 23 as first and second input signals, and a smoothing circuit 30 for smoothing output signal from the amplifier 29.

Figures 8A, 8B:
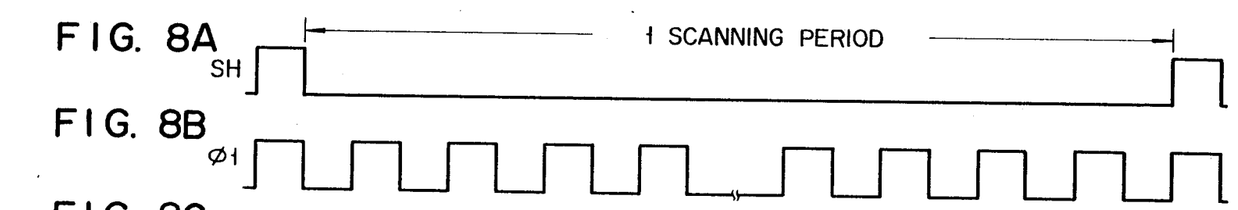
FIGS. 8A to 8G are time charts of signals at the key portions in the controller shown in FIG. 7.
Figures 8C, 8D, 8E, 8F:
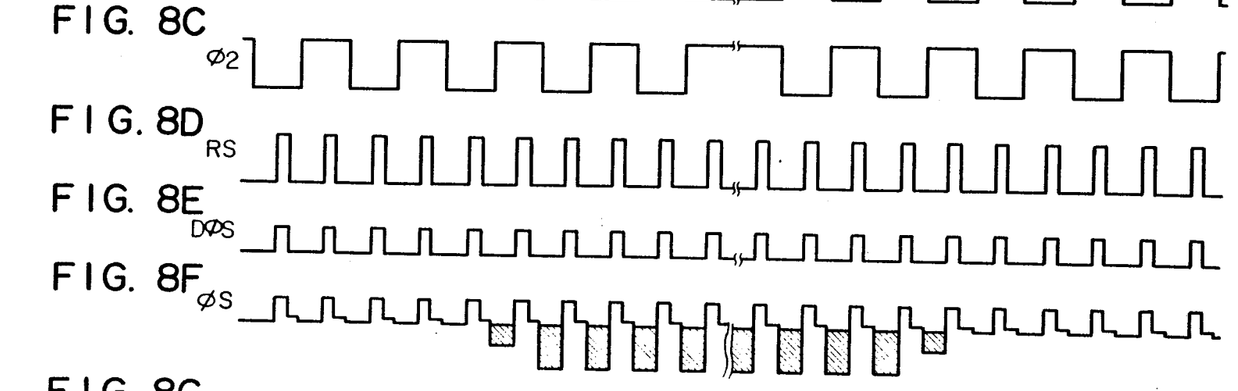
Figure 8G:
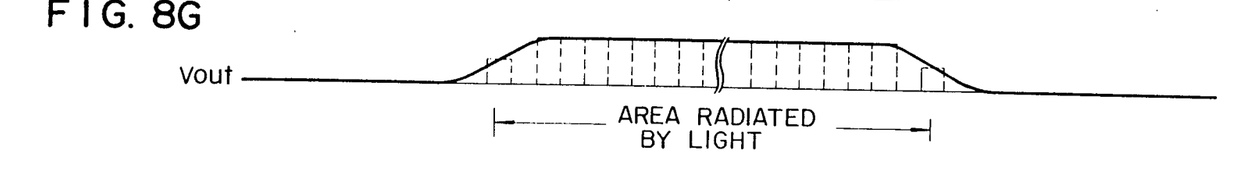

In the line sensor 5 and the sensor control circuit 8 thus arranged, the oscillator 24 stably produces clock pulses. The clock pulse from the oscillator 24 is input to the frequency divider 26 and frequency-divided at a proper frequency-dividing ratio to produce a signal SH, as shown in FIG. 8A. The output pulse from the oscillator 24 is also supplied to the frequency divider 27 and frequency-divided at a proper ratio to produce a clock pulse $\phi 2$ as shown in FIG. 8C. The clock pulse from the oscillator 24 is also supplied to the frequency divider 25 and frequency-divided at a proper frequency dividing ratio to form a pulse signal RS, as shown in FIG. 8D. The output signal of the frequency divider 25 is supplied to the frequency divider 28 and frequency-divided to form a clock pulse $\phi 1$, as shown in FIG. 8B. The signal SH is applied to the shift gates $21_2$ and $21_3$ to control the transfer of the charge stored in the photosensitive area $21_1$ to the analog shift registers $21_4$ and $21_5$. The clock pulses $\phi 1$ and $\phi 2$ are both applied to the analog shift registers $21_4$ and $21_5$ to sequentially shift the charge data stored therein in a serial fashion. The pulse signal RS is applied as a reset signal to the amplifier 22 and the compensation circuit 23. When the signals SH, $\phi 1$, $\phi 2$ and RS are applied from the sensor control circuit 8 to the line sensor 5, the amplifier 22 of the line sensor 5 produces a pulse signal $\phi S$ as shown in FIG. 8F and the compensation circuit 23 produces a pulse signal $D\phi S$ a shown in FIG. 8E. In the pulse signal $\phi S$, the hatched area corresponds to that area of the photosensitive area $21_1$ upon which light beams impinges. The pulse signals $\phi S$ and $D\phi S$ are input to the differential amplifier 29, and its difference component is amplified. The output signal from the amplifier 29 is input to the smoothing circuit 30 and smoothed to generate a signal Vout as shown in FIG. 8G. The output signal Vout is input to the differential circuit 11 in the automatic focusing apparatus shown in FIG. 1.

Figure 9:
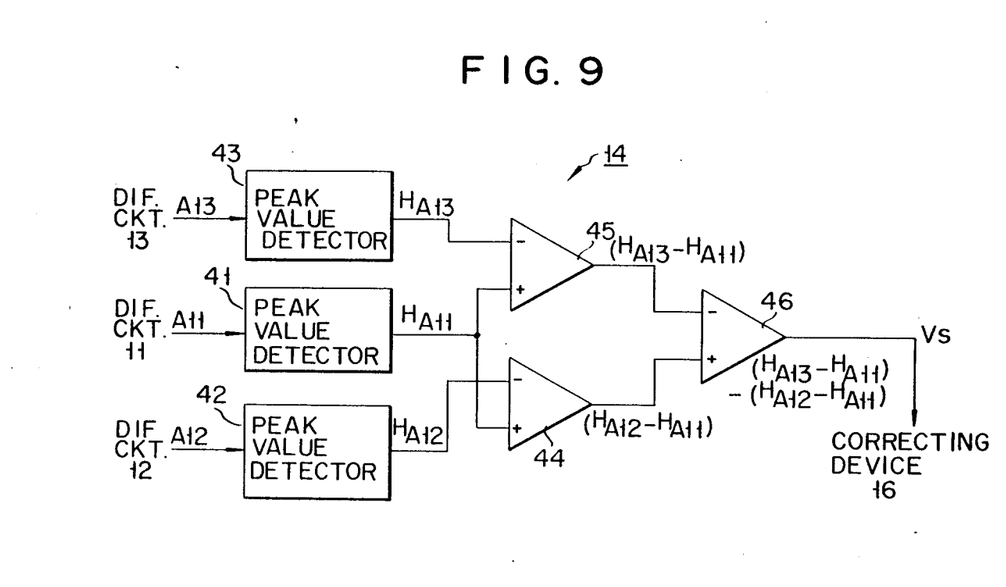
FIG. 9 shows a block diagram of a detecting circuit used in the automatic focusing apparatus of FIG. 1.

FIG. 9 shows a block diagram of the out-of-focus detector 14. The circuit 14 is comprised of a peak value detctor 31 for receiving the output signal A11 from the differential amplifier circuits 11, a peak value detector 42 for receiving the output signal A12 from the differential amplifier circuit 12, a peak value detector 43 for receiving the output signal A13 from the differential amplifier 13, a differential amplifier 44 for receiving the output signals $H_{A11}$ and $H_{A12}$ from the peak value detectors 41 and 42, and a second differential amplifier 45 for receiving the output $H_{A11}$ and $H_{A13}$ from the peak value detectors 41 and 43, and a third differential amplifier 46 for receiving the output signals ($H_{A12}-H_{A11}$), ($H_{A13}-H_{A11}$) from the amplifiers 44 and 45.

In the out-of-focus detector 14 thus arranged, the peak value detectors 41, 42 and 43 receive respectively the output signals A11 to A13 from the differential circuits 11, 12 and 13 and detect the peak values $H_{A11}$, $H_{A12}$ and $H_{A13}$. The peak values $H_{A11}$ and $H_{A12}$ detected by the detectors 41 and 42 are applied to the differential amplifier 44 which then performs the operation of ($H_{A12}-H_{A11}$). Similarly, the peak values $H_{A11}$ and $H_{A13}$ detected by the detectors 41 and 43 are input to the differential amplifier 45 which then performs the operation of ($H_{A13}-H_{A11}$). The results of the operations performed in the amplifiers 44 and 45 are input to the amplifier 46 which in turn performs the operation ($H_{A13}-H_{A11}$)−($H_{A12}-H_{A11}$). The result of the operation is output as the detecting signal Vs from the out-of-focus detector 14. In the automatic focusing apparatus shown in FIG. 1, when the pattern P1 is formed on the flat portion of the semiconductor substrate 1 and the pattern P1 is located at the predetermined proper position, the pattern P1 is imaged on the input face of the first line sensor 5. Then: $H_{A12}=H_{A13}$, $H_{A11}>H_{A12}$, and $H_{A11}>H_{13}$, Vs=0. The out-of-focus detecting signal Vs is zero. When the pattern P1 is formed on the convex portion of the semiconductor substrate 1 and is located off the predetermined proper position, the output signal Vs indicates an amount and a direction of the displacement of the pattern P1 from the predetermined position. The output signal Vs is input to the correcting device 16.

Figure 10:
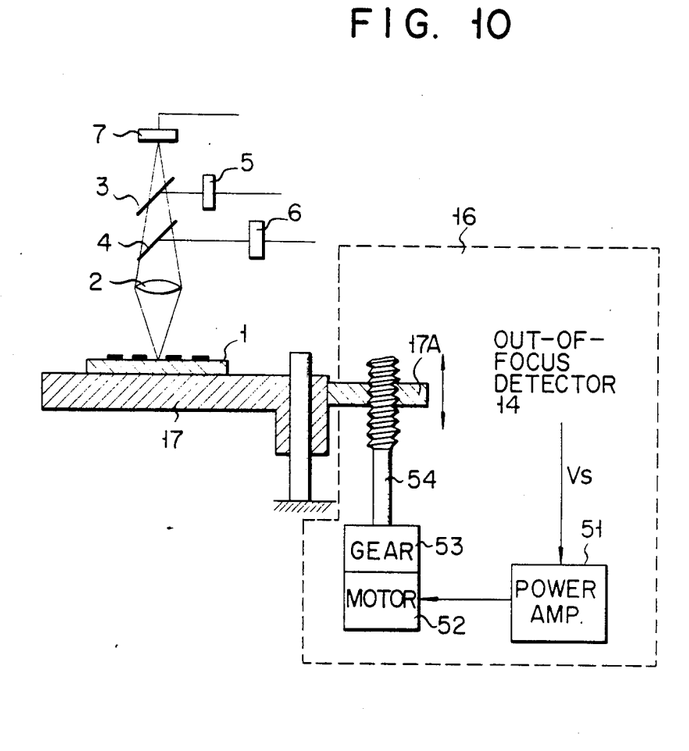
FIG. 10 shows a schematic and block diagram of a correcting device in the apparatus shown in FIG. 1.

FIG. 10 shows an example of the correcting device 16. The correcting device 16 is comprised of a power amplifier 51 for amplifying an output signal Vs from the out-of-focus detector 14, a motor 52 for driving the output signal from the amplifier 51, a gear mechanism 53 for reducing a rotating speed of the motor 52, a screw member 54 which is driven by the output signal from the motor 52 and has its speed reduced by the gear mechanism 53 to move the semiconductor substrate 1 in the up or down direction. The output signal Vs from the out-of-focus detector 14 is input to the power amplifier 51 and amplified to a desired level. The amplified signal is supplied to the motor 52 to rotate the motor 52. An amount and a direction of the rotation of the motor 52 are determined by the output signal from the out-of-focus detector 14. The rotating force output from the motor 52 is supplied to the gear mechanism 53 where it is reduced in its speed. The rotating force derived from the gear mechanism 53 is transferred to the screw member 54 for its rotation. The screw member 54 is in mesh with the female screw member 17A mounted to the support table 17 for supporting the semiconductor substrate 1. With rotation of the screw member 54 driven by the motor 52, the support table 17 is moved up or down. The rotating direction and amount of the screw member 54 are determined by the amount and direction of the rotation of the screw member 54 which are also defined by the output signal from the out-of-focus detector 14. As previously stated, the output signal Vs from the out-of-focus detector 14 determines the amount and direction of rotation of the motor 52 so that the support table 17 moves by the amount of the displacement of the pattern P1 and in the direction opposite to the direction of the displacement. Thus, the distance between the objective 2 and the substrate 1 is kept at predetermined proper distance. In other words, the pattern P1 is kept at the predetermined proper distance from the objective 2, with the distance the pattern P1 is imaged on the input face of the first line sensor 5 positioned at the focal point $P_{FR3}$. The motor 52 as a means for driving the support table 17 may be substituted by a piezoelectric element or a means utilizing electromagnetic force.

As described above, the present invention employs an electrical means for detecting the out-of-focus, unlike the conventional apparatus using an airomicro type detector. This brings about many advantages. The apparatus is light in weight. The size of the focusing apparatus per se is reduced. An accuracy in the detection of the out-of-focus is high. A response of the detection is quick. Further, a single optical system is used for both the optical system for detecting the out-of-focus and for inspecting a pattern on the semiconductor substrate. This feature leads to simplification of the structure and size-reduction of the focusing apparatus, and therefore to reduction of the cost to manufacture.

It is apparent to those skilled persons in the art that the present invention is not limited by the above-mentioned embodiment. For effecting the focusing operation, in the embodiment mentioned above, the pattern is so moved that it is imaged at the focal point of the optical system. In other words, the semiconductor substrate 1 is moved relative to the objective 2. However the focusing may be done by vertically moving the optical system in place of the semiconductor substrate 1. In the above-mentioned embodiment, one line sensor of which the input face is positioned at the focal point of the objective, is used and additional two line sensors are used of which the input faces are displaced farther from and closer to the focal points of the objective. An out-of-focus of the substrate under inspection is detected on the basis of the output signals from these three line sensors. However, only one line sensor suffices to check the position of the pattern.

It should be understood that the present invention may variously be changed and modified within the spirit of the invention.

What is claimed is:

1. An automatic focusing apparatus for placing a semiconductor substrate into focus relative to an inspecting system so that a pattern formed on a surface of the semiconductor substrate can be inspected by the inspecting system via light emanating from the substrate to the apparatus comprising:
   an objective lens disposed in opposition to the surface of the substrate having the pattern formed thereon, the objective lens having a predetermined focal length;
   first and second reflection means for reflecting respective portions of the light from the surface of the substrate as refracted through the objective lens;

a first photosensitive element for receiving light reflected from said first reflection means, said first photosensitive element being positioned to receive light at the focal length of said objective lens and producing an output according to an amount of light incident upon said first photosensitive element;

a second photosensitive element for receiving light reflected from said second reflecting means, said second photosensitive element being positioned at a preselected distance closer to the focal length of said objective lens and producing an output according to an amount of light incident upon said second photosensitive element;

a third photosensitive element aligned with said objective lens to receive light refracted therethrough, said third photosensitive element being positioned at a preselected distance farther from the objective lens than a focal length of said objective lens and producing an output according to an amount of light incident upon said third photosensitive element;

first sensing means for producing a first electrical signal based upon the output of said first photosensitive element;

second sensing means for producing a second electrical signal based upon the output of said second photosensitive element;

third sensing means for producing a third electrical signal based upon the output of said third photosensitive element;

detecting means coupled to said first, second and third sensing means for producing a focus correction signal by comparing the first, second and third electrical signals; and correcting means coupled to said detecting means for moving the substrate relative to the objective lens in response to the focus correction signal so as to place the substrate in focus relative to the first photosensitive element;

the inspecting system being coupled to said first photosensitive element for determining whether the pattern on said substrate has defects.

2. An automatic focusing apparatus according to claim 1 wherein said first and second reflection means are mirrors aligned with an opical axis of the objective lens.

3. An automatic focusing apparatus according to claim 1 wherein the detecting means includes first, second and third differential circuits for differentiating the output of said first, second and third sensing means respectively.

4. An automatic focusing apparatus according to claim 3, wherein said detecting means includes a first peak detecting circuit for detecting a peak value of an output signal from said first differentiating circuit, a second peak detecting circuit for detecting a peak value of an output signal from said second differentiating circuit, a third peak detecting circuit for detecting a peak value of an output signal from said third differentiating circuit, first circuit means for detecting a difference between peak values produced from said first peak detecting circuit and said second peak detecting circuit, second circuit means for detecting a difference between peak values produced from said first peak detecting circuit and said third peak detecting circuit; and a third circuit means for detecting a difference between the difference of peak value from said first circuit means and the difference of peak value from said second circuit means.

5. An automatic focusing apparatus according to claim 1, wherein said correcting means includes amplifying means for amplifying an output signal from said detecting means and means for adjusting said displacement on the basis of said output signal from said amplifying means.

6. An automatic focusing apparatus according to claim 1, wherein said first to third photosensitive elements are respectively line sensors.

* * * * *